United States Patent [19]

Hagley et al.

[11] Patent Number: 4,950,924
[45] Date of Patent: Aug. 21, 1990

[54] HIGH SPEED NOISE IMMUNE BIPOLAR LOGIC FAMILY

[75] Inventors: William A. Hagley, Waterloo; Derek J. Day, Kanata; Jingming Xu, Etobicoke, all of Canada

[73] Assignee: Northern Telecom Limited, Montreal, Canada

[21] Appl. No.: 350,193

[22] Filed: May 11, 1989

[51] Int. Cl.⁵ .............................................. H03K 19/02
[52] U.S. Cl. .................................... 307/446; 307/570; 307/544
[58] Field of Search ................ 307/246, 446, 544, 570

[56] References Cited

U.S. PATENT DOCUMENTS

| | | | |
|---|---|---|---|
| 3,495,097 | 2/1970 | Abramson et al. | 307/570 |
| 4,057,844 | 6/1977 | Smedley | 307/544 |
| 4,115,740 | 9/1978 | Yoshida et al. | 307/570 |
| 4,418,291 | 11/1983 | Watson, Jr. | 307/446 |
| 4,638,186 | 1/1987 | McLaughlin | 307/570 |
| 4,672,245 | 6/1987 | Majumdar et al. | 307/570 |
| 4,716,310 | 12/1987 | Tanizawa et al. | 307/570 |
| 4,798,979 | 1/1989 | Lee et al. | 307/450 |
| 4,853,561 | 8/1989 | Gravrok | 307/443 |
| 4,868,904 | 9/1989 | Gravrok et al. | 307/279 |
| 4,885,486 | 12/1989 | Shekhawat et al. | 307/570 |

FOREIGN PATENT DOCUMENTS 0159024  9/1983  Japan .................................... 307/570
0231920 12/1984  Japan .................................... 307/446

OTHER PUBLICATIONS

Proceedings of 1987 IEEE Bipolar Circuits and Technology Meeting, Ed. J. Jopke, Minneapolis, 1987, IEEE pp. 50–53.

Primary Examiner—Stanley D. Miller
Assistant Examiner—T. Cunningham
Attorney, Agent, or Firm—C. W. Junkin

[57] ABSTRACT

A logic gate comprises a bipolar switching transistor and a depletion mode field effect load device. A current independent voltage source and a voltage independent current source are connected in series between an input terminal of the logic gate and a base of the bipolar transistor. The voltage independent current source is a depletion mode field effect transistor having a source and drain which are connected in series with the current independent voltage source and the base of the bipolar transistor. A feedback device is connected in series between a gate of the current source field effect transistor and a gate of the load transistor. A discharge device is connected in parallel with the current independent voltage source for actively discharging a base-emitter junction of the bipolar transistor during switching of the bipolar transistor from an on state to an off state. The logic gate is particularly suitable for use in memory elements.

11 Claims, 2 Drawing Sheets

HIGH SPEED NOISE IMMUNE BIPOLAR LOGIC FAMILY

FIELD OF THE INVENTION

This invention relates generally to bipolar logic gates and more particularly to gates which operate at high speed and which are relatively immune to noise.

BACKGROUND OF THE INVENTION

Conventionally, bipolar logic families such as Emitter Coupled Logic (ECL) use small voltage swings to achieve high speed operation. The small logic swings require logic gates to switch a large amount of current in order to maintain acceptable noise margins. Consequently the high speed operation is obtained at the expense of relatively high power dissipation.

Gravrok and Warner have recently demonstrated a new gate architecture which uses a voltage regulating and a current limiting element in series with the gate input to produce bipolar gates having large logic swings and relatively low power dissipation (Proceedings of the 1987 IEEE Bipolar Circuits and Technology Meeting, pp. 50–53). The large logic swings result in good noise immunity.

Unfortunately, high speed operation of the Gravrock and Warner architecture is limited by a relatively long rise time.

SUMMARY OF THE INVENTION

This invention provides a bipolar logic inverter with good noise immunity and low power dissipation, and which operates well at high speed.

Thus, the invention provides a logic gate, comprising:
an input terminal, an output terminal, and a pair of voltage supply terminals;
a bipolar switching transistor having a base, a collector, an emitter, an emitter-base junction, and a collector-base junction, the emitter being connected to one of the voltage supply terminals, and the collector being connected to the output terminal;
a load device connected between the collector of the switching transistor and the other of the voltage supply terminals;
a current independent voltage source and a voltage independent current source connected in series between the input terminal and the base of the bipolar transistor; and
discharge means connected in parallel with the current independent voltage source for actively discharging the base-emitter junction of the bipolar switching transistor during switching of the bipolar switching transistor from an on state to an off state.

Without the discharge means, the rise time of the logic gate would be limited by the rate at which carriers in the base-emitter junction of the bipolar switching transistor can disperse through various recombination processes. The discharge means reduces the rise time by providing for active discharge of the base-emitter junction during switching of the bipolar switching transistor from an on state to an off state. The reduced rise time improves the high speed operation of the logic gate as compared to architecture proposed by Gravrock and Warner.

The current independent voltage source may comprise a first diode, and the discharge means may comprise a second diode connected in antiparallel with the first diode. Preferably, the second diode has a lower threshold voltage than the first diode.

The voltage independent current source may comprise a field effect current source transistor having a gate, a source and a drain, the source and drain being connected in series between the current independent voltage source and the base of the bipolar switching transistor. The gate of the current source transistor may be connected to the base of the bipolar switching transistor, or may be connected to the gate of the load transistor via feedback means. Feedback from the load transistor to the current source transistor limits the input current when the logic gate is in a static state, thereby reducing the static power consumption of the gate. Preferably, the feedback means comprises a diode.

The load device may be a depletion mode field effect transistor having a gate, a source and a drain, the source and drain of the field effect transistor being connected in series between the other of the voltage supply terminals and the collector of the bipolar transistor, and the gate of the field effect load transistor being connected to the output terminal;

The bipolar switching transistor may be an AlGaAs/GaAs heterojunction bipolar transistor.

The logic gate as defined above may have a plurality of input terminals with a respective current independent voltage source and a respective voltage independent current source connected in series between each input terminal and the base of the bipolar transistor, and respective discharge means connected in parallel with each current independent voltage source for actively discharging the base-emitter junction during switching of the bipolar switching transistor from an on state to an off state.

BRIEF DESCRIPTION OF THE DRAWINGS

Embodiments of the invention are described below with reference to the accompanying drawings, in which.

DESCRIPTION OF EMBODIMENTS

Figure 1:
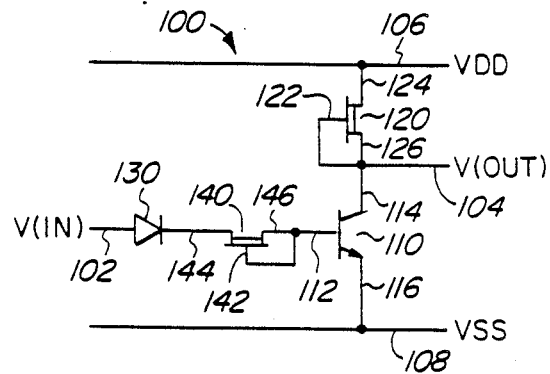
FIG. 1 is a schematic diagram of an inverter proposed by Gravrock and Warner.

FIG. 1 is a schematic diagram of an inverter 100 proposed by Gravrock and Warner (Proceedings of the 1987 IEEE Bipolar Circuits and Technology Meeting, pp. 50–53). The inverter 100 comprises an input terminal 102, an output terminal 104 and a pair of voltage supply terminals 106, 108.

A bipolar switching transistor 110 of the inverter 100 has a base 112, a collector 114 and an emitter 116. The emitter 116 is connected to one of the voltage supply terminals 108.

A load device of the inverter 100 in the form of a depletion mode field effect transistor 120 has a gate 122, a source 124 and a drain 126. The source 124 and drain 126 are connected in series between the other voltage supply terminal 106 and the collector 114 of the bipolar transistor 110. The gate 122 is connected to the output terminal 104 of the inverter.

A diode 130 and another depletion mode field effect transistor 140 are connected in series between the input terminal 102 of the inverter and the base 112 of the bipolar switching transistor 110. The field effect transistor 140 has a gate 142, a source 144 and a drain 146. The source 144 and the drain 146 are connected in series between the diode 130 and the base 112 of the bipolar transistor 110. The gate 142 is connected to the base 112 of the bipolar transistor 110.

The diode 130 acts as a current independent voltage source, giving a voltage drop which is largely independent of the input current. The field effect transistor 140 acts as a voltage independent current source, limiting the input current essentially independently of the applied voltage bias. There is no appreciable current into the base 112 of the bipolar transistor 110 until the voltage applied to the input terminal 102 exceeds the threshold voltage of the diode 130. Once the input voltage exceeds the threshold voltage of the diode 130, the field effect transistor 140 limits the input current to the bipolar transistor 110 to prevent its saturation, thereby enhancing the high speed operation of the inverter 100.

The circuit of FIG. 1 was implemented as a hybrid using an n+ GaAs diode 130, GaAs depletion mode field effect transistors 120, 140, and a GaAs/AlGaAs heterojunction bipolar transistor 110. The heterojunction bipolar transistor 110 was fabricated using molecular beam epitaxy and had a current gain exceeding $10^3$.

The transfer characteristics for the resulting hybrid were measured. Operating from a three volt power supply, the output high logic level was within 1 mV of $V_{dd}$ and the output low logic level was constant at 100 mV. The noise margin was measured using a pair of cross-coupled inverters. The supply voltages of one of the inverters were held constant while a supply voltage of the other inverter was ramped. We define the noise margin as the point at which the output of the inverter with constant supply voltages changes state. This method allows a direct measurement of the noise margin.

The measured noise margin at 300 degrees Kelvin was 1.24 V or 43% of the logic swing and showed approximately 0.01% variation per degree Kelvin.

The transient response of the hybrid was measured. The hybrid had a rise time exceeding 5 microseconds while driving a 50 pF load. The fall time was measured at 80 nanoseconds into 50 pF. We attribute the slow rise time to charge storage in the diode 130, field effect transistor 140 and the base emitter junction of the bipolar transistor 110. As the input voltage falls below the threshold voltage of the diode 130, the charge stored in the base-emitter junction of the bipolar transistor 110 can no longer be removed by the input current. The rise time of the output is then limited by the rate at which carriers in the base-emitter junction can disperse through various recombination processes.

In order to reduce the effect of the stored charge, we modified the inverter 100 shown in FIG. 1. The modified inverter 200 according to a first embodiment is shown schematically in FIG. 2.

Unlike the inverter 100 of FIG. 1, the inverter 200 according to the first embodiment includes discharge means in the form of a diode 210 connected in antiparallel with the diode 130 which acts as a current independent voltage source. The diode 210 provides a discharge path for discharging the base-emitter junction of the bipolar transistor 110 during switching of the bipolar transistor 110 from an on state to an off state. The dimensions of the diode 210 are selected to ensure that the diode 210 has a lower threshold voltage than the diode 130 which acts as a current independent voltage source.

The rise time of the inverter 200 is limited by the input current and the base-emitter junction capacitance rather than the rate of recombination in the base-emitter junction of the bipolar transistor 110. Measured DC transfer characteristics for the inverter 200 were identical to the measured transfer characteristics for the inverter 100 of FIG. 1. However, the measured rise time for the inverter 200 was 80 nanoseconds into a 50 pF load, considerably shorter than the rise time for the inverter 100 of FIG. 1. This represents a switching speed improvement approaching a factor of 60.

Figure 4:
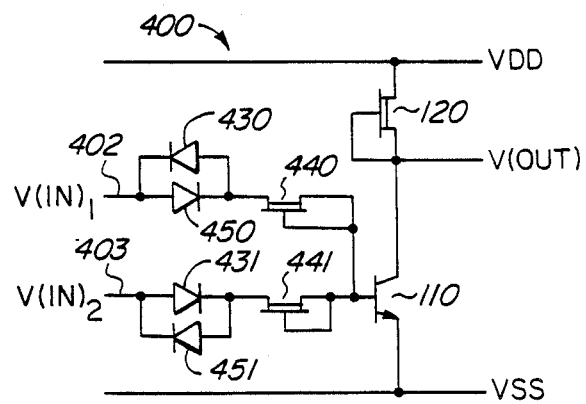
FIG. 4 is a schematic diagram of a two input NOR gate according to a third embodiment.

Indeed, the measured rise time for the inverter 200 was limited by the capacitances associated with the measuring apparatus used. The combined capacitance of the oscilloscope input and the cable capacitance was calculated to be 50 pF. The rise time of an unloaded inverter 200 as shown in FIG. 4 may be as short as 140 picoseconds.

Operating parameters of the inverter 200 were calculated using conventional SPICE simulation software to determine the limiting factors in the operation of the device. The calculations assumed a heterojunction bipolar transistor 110 having a 5 micron by 5 micron emitter area, n+ overlap diodes 130, 210 and 1 micron by 1.5 micron field effect transistors 120, 140. The input of the inverter 200 was assumed to be driven by a 3 V pulse with 200 picosecond rising and falling edges. Simulations were performed both with no load and with external capacitive load to determine the delay loading of the inverter 200.

The propagation delay through the inverter 200 was 80 picoseconds on the rising edge and 100 picoseconds on the falling edge with 140 picosecond rise and fall times. We attribute the asymmetry in the transfer characteristics to a difference in collector and emitter junction areas resulting in a relatively high capacitance in the emitter junction. The capacitive loading delay was calculated to be 1.5 picoseconds per fF of external load, which explains the relatively long delay times measured on the hybrid circuit.

The power dissipated in the logic high output state was approximately 21 nW, while the power dissipated in the logic low output state was 1.16 mW. The power dissipation in the logic high output state was determined by the leakage current of the collector junction, while the power dissipation in the logic low output state was determined by the size of the load field effect transistor 120 and the forward base current provided by the input.

Figure 2:
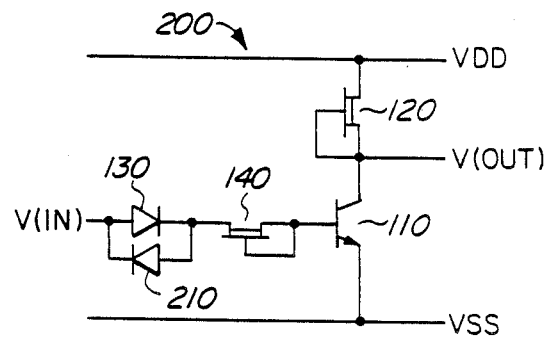
FIG. 2 is a schematic diagram of an inverter according to a first embodiment.
Figure 3:
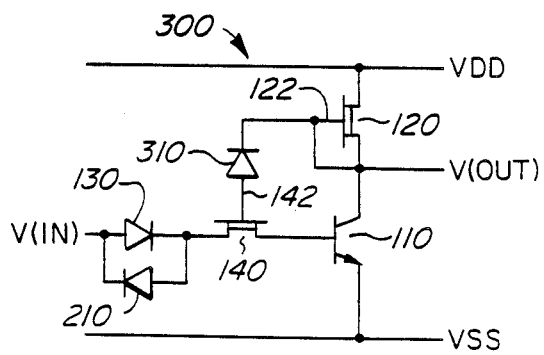
FIG. 3 is a schematic diagram of an inverter according to a second embodiment.

A substantial power dissipation saving can be realized by modifying the inverter 200 of FIG. 2. A modified inverter 300 according to a second embodiment is shown schematically in FIG. 3.

In the modified inverter 300, feedback means in the form of a diode 310 is connected between the gate 142 of the field effect transistor 140 which acts as a voltage independent current source and the gate 122 of the load field effect transistor 120. The diode 310 gates the input field effect transistor 140 to limit the input current when the inverter 300 is in a static state. This limits the forward base current in the output logic low state without proportionately reducing the current available during switching.

The DC characteristics of the modified inverter 300 are essentially the same as those of the inverter 200 according to the first embodiment, except that the input current limits at a substantially smaller value. Consequently, the power dissipation is reduced to approximately 0.75 mW for the output logic low state, a 36% reduction relative to the corresponding power dissipation for the inverter 200 according to the first embodiment. The noise immunity and DC output levels are essentially unaffected by the use of the diode 310.

The propation delay is slightly increased by the additional capacitance associated with the diode 310 to approximately 100 picoseconds on the rising edge and 120 picoseconds on the falling edge with 200 picosecond rise and fall times. The overall propagation delay is increased by approximately 22% due to the diode 310. For most applications, the decrease in switching speed is justified by the large reduction in power dissipation.

A pair of cross-coupled inverters 300 can be used to implement memory storage elements. The high noise immunity of the inverters 300 assures high data integrity storage cells. The sense amplifier design in a memory employing such storage elements can be reduced in size since transients on the sense lines are less likely to cause spurious write errors. A transient approaching 1.2 V is required to cause such a memory cell to change state when operated on a 3 V power supply.

The power dissipation of a static memory cell using a pair of cross-coupled inverters 300 is equal to the dissipation of only one inverter 300 since the inverter 300 dissipates power only in the output logic low state and, by the nature of cross-coupled inverters, only one inverter is in this state at any given time. The only change in the operating current of such a memory cell occurs during switching and is due to the difference in the input current transients for the rising and falling edges. Access times for such memory cells approach the switching speed of the inverters 300.

Figure 5:
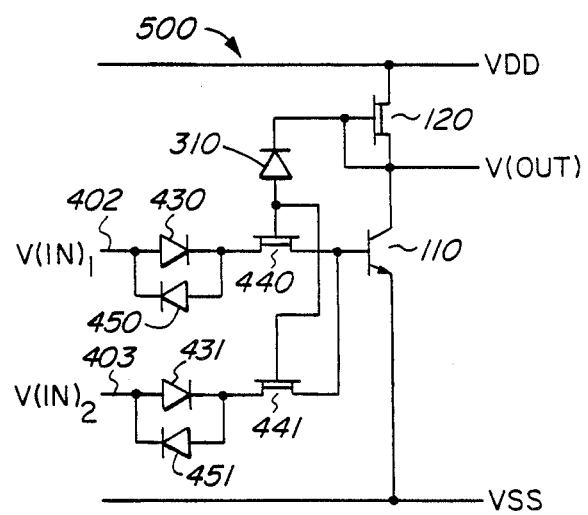
FIG. 5 is a schematic diagram of a two input NOR gate according to a fourth embodiment.

In a third and fourth embodiments shown in FIGS. 4 and 5 respectively, a two input NOR gates 400 and 500 are similar to the inverter 200 of the first embodiment and the inverter 300 of the second embodiment respectively, except that two input terminals 402, 403 are provided, respective diodes 430 431 and respective field effect transistors 440, 441 are connected in series between each input terminal and the base of the bipolar transistor 110, and respective diodes 450, 451 are connected in antiparallel with each of the diodes 430, 431. The diodes 430, 431 act as current independent voltage sources, the field effect transistors 440, 441 act as voltage independent current sources, and the diodes 450, 451 act as discharge means for actively discharging the base-emitter junction of the bipolar transistor 110 from an on state to an off state as in the first and second embodiments.

According to the Gravrock and Warner reference, the depletion mode field effect load transistors of the embodiments described above may be replaced with bipolar load transistors which are complementary to the bipolar switching transistors, the gate of each bipolar load transistor being connected to a respective input terminal via a respective series connection of a voltage independent current source and a current independent voltage source. The current independent voltage sources may be implemented as a plurality of series connected forward biased diodes, as a n+p-n+ punch-through structure or as a Zener diode. The voltage independent current source may be implemented as a bipolar current mirror structure. These variations of the embodiments described above are within the scope of the invention as claimed below.

The input terminals, the output terminals, the voltage supply terminals, the bipolar switching transistors, the load devices, the current independent voltage sources, the voltage independent current sources and the discharge means of the embodiments described above may be monolithically integrated on a common substrate.

We claim:

1. A logic gate, comprising:
an input terminal, an output terminal, and a pair of voltage supply terminals;
a bipolar switching transistor having a base, a collector, an emitter, an emitter-base junction, and a collector-base junction, the emitter being connected to one of the voltage supply terminals and the collector being connected to the output terminal;
a load device connected between the collector of the switching transistor and another of the voltage supply terminals, the load device comprising a depletion mode field effect transistor having a gate, a source and a drain, the drain being connected to the other of the voltage supply terminals, the source being connected to the collector of the bipolar switching transistor, and the gate being connected to the output terminal;
a current independent voltage source and a voltage independent current source connected in series between the input terminal and the base of the bipolar switching transistor, the voltage independent current source comprising a depletion mode field effect transistor having a gate, a source and a drain, the source being connected to the current independent voltage source and the drain being connected to the base of the bipolar switching transistor;
discharge means connected in parallel with the current independent voltage source for actively discharging the base-emitter junction during switching of the bipolar switching transistor from an on state to an off state; and
feedback means connected in series between the gate of the voltage independent current source field effect transistor and the gate of the field effect load transistor.

2. A logic gate as defined in claim 1, wherein:
the current independent voltage source comprises a first diode; and
the discharge means comprises a second diode connected in antiparallel with the first diode.

3. A logic gate as defined in claim 2, wherein:
the second diode has a lower threshold voltage than the first diode.

4. A logic gate as defined in claim 1, wherein:
the feedback means comprises a diode.

5. A logic gate as defined in claim 1, wherein:
the bipolar switching transistor is a heterojunction bipolar transistor.

6. A logic gate as defined in claim 5, wherein:
the bipolar switching transistor is an AlGaAs/GaAs heterojunction bipolar transistor.

7. A logic gate, comprising:
a plurality of input terminals, an output terminal, and a pair of voltage supply terminals;
a bipolar switching transistor having a base, a collector, an emitter, an emitter-base junction, and a collector-base junction, the emitter being connected to one of the voltage supply terminals and the collector being connected to the output terminal;

a load device connected between the collector of the switching transistor and another of the voltage supply terminals, the load device comprising a depletion mode field effect transistor having a gate, a source and a drain, the drain being connected to the other of the voltage supply terminals, the source being connected to the collector of the bipolar switching transistor, and the gate being connected to the output terminal;

a respective current independent voltage source and a respective voltage independent current source connected in series between each input terminal and the base of the bipolar switching transistor, each voltage independent current source comprising a depletion mode field effect transistor having a gate, a source and a drain, the source being connected to the current independent voltage source and the drain being connected to the base of the bipolar switching transistor;

respective discharge means connected in parallel with each current independent voltage source for actively discharging the base-emitter junction during switching of the bipolar switching transistor from an on state to an off state; and feedback means connected in series between the gate of every voltage independent current source field effect transistor and the gate of the field effect load transistor.

8. A logic gate as defined in claim 7, wherein:

each current independent voltage source comprises a diode; and each discharge means comprises another diode connected in antiparallel with the corresponding diode which acts as current independent voltage source.

9. A logic gate as defined in claim 7, wherein:

the feedback means comprises a diode.

10. A logic gate as defined in claim 1, wherein the input terminal, the output terminal, the voltage supply terminals, the bipolar switching transistor, the load device, the current independent voltage source, the voltage independent current source and the discharge means are all monolithically integrated on a common substrate.

11. A logic gate as defined in claim 7, wherein the input terminals, the output terminal, the voltage supply terminals, the bipolar switching transistor, the load device, the current independent voltage sources, the voltage independent current sources and the discharge means are all monolithically integrated on a common substrate.

* * * * *